（12）United States Patent
Cheng (10) Patent No.: US 12,310,087 B2
(45) Date of Patent: May 20, 2025

(54) SCHOTTKY DIODE AND MANUFACTURING METHOD THEREFOR (71) Applicant: ENKRIS SEMICONDUCTOR, INC., Jiangsu (CN)

(72) Inventor: Kai Cheng, Jiangsu (CN)

(73) Assignee: ENKRIS SEMICONDUCTOR, INC., Jiangsu (CN)

( * ) Notice: Subject to any disclaimer, the term of this patent is extended or adjusted under 35 U.S.C. 154(b) by 501 days.

(21) Appl. No.: 17/779,064

(22) PCT Filed: Oct. 30, 2020

(86) PCT No.: PCT/CN2020/125413
§ 371 (c)(1),
(2) Date: May 23, 2022

(87) PCT Pub. No.: WO2021/139361
PCT Pub. Date: Jul. 15, 2021

(65) Prior Publication Data
US 2022/0416092 A1 Dec. 29, 2022

(30) Foreign Application Priority Data

Jan. 10, 2020 (CN) .......................... 202010026493.1

(51) Int. Cl.
*H10D 8/60* (2025.01)
*H10D 8/01* (2025.01)
*H10D 62/85* (2025.01)

(52) U.S. Cl.
CPC ............... *H10D 8/60* (2025.01); *H10D 8/051* (2025.01); *H10D 62/8503* (2025.01)

(58) Field of Classification Search
CPC ...... H10D 8/60; H10D 8/051; H10D 62/8503; H10D 62/824; H10D 62/10; H10D 62/124; H10D 64/23
See application file for complete search history.

(56) References Cited

U.S. PATENT DOCUMENTS 7,898,004 B2 3/2011 Wu et al.
8,237,198 B2 8/2012 Wu et al.
(Continued)

FOREIGN PATENT DOCUMENTS

CN 102308390 A 1/2012
CN 104134704 A 11/2014
(Continued)

OTHER PUBLICATIONS

State Intellectual Property Office of the People's Republic of China, Office Action and Search Report Issued in Application No. 2020100264931, Oct. 31, 2024, 6 pages. (Submitted with Machine Translation).

(Continued)

*Primary Examiner* — Fernando L Toledo
*Assistant Examiner* — Marshall Mu-Nuo Hatfield
(74) *Attorney, Agent, or Firm* — The Small Patent Law Group LLC; Christopher R. Carroll (57) ABSTRACT

Provided are a Schottky diode and a manufacturing method therefor. The Schottky diode includes a nitride channel layer; a nitride barrier layer formed on the nitride channel layer; a nitride cap layer formed on the nitride barrier layer, wherein the nitride cap layer includes an active region and an inactive region; a passivation layer formed on the nitride cap layer, where the passivation layer includes a first groove penetrating through the passivation layer to expose the nitride cap layer; a dielectric layer located on the passivation layer and an inner wall of the first groove, wherein the dielectric layer forms a second groove, and the dielectric layer includes a third groove penetrating through the dielectric layer to expose a part of the active region of the nitride cap layer; and an anode layer formed in the second groove and the third groove and in contact with the active region.

10 Claims, 6 Drawing Sheets (56) References Cited

U.S. PATENT DOCUMENTS

| | | | |
|---|---|---|---|
| 8,541,818 | B2 | 9/2013 | Wu et al. |
| 8,946,724 | B1* | 2/2015 | Shinohara ............ H10D 62/824 |
| | | | 257/104 |
| 9,041,065 | B2 | 5/2015 | Wu et al. |
| 2010/0140660 | A1 | 6/2010 | Wu et al. |
| 2011/0127541 | A1 | 6/2011 | Wu et al. |
| 2012/0267640 | A1 | 10/2012 | Wu et al. |
| 2014/0054603 | A1 | 2/2014 | Wu et al. |
| 2015/0053991 | A1 | 2/2015 | Chiang et al. |
| 2017/0077275 | A1* | 3/2017 | Okazaki ................. H10D 64/64 |
| 2019/0097034 | A1 | 3/2019 | Nakata |

FOREIGN PATENT DOCUMENTS

| | | | |
|---|---|---|---|
| CN | 104362181 | A | 2/2015 |
| CN | 104465748 | A | 3/2015 |
| CN | 105321994 | A | 2/2016 |
| CN | 108376707 | A | 8/2018 |
| CN | 108767017 | A * | 11/2018 |
| CN | 109192788 | A | 1/2019 |
| CN | 110416318 | A | 11/2019 |
| CN | 211654831 | U | 10/2020 |
| JP | 2009060065 | A | 3/2009 |

OTHER PUBLICATIONS

ISA State Intellectual Property Office of the People's Republic of China, International Search Report Issued in Application No. PCT/CN2020/125413, Jan. 29, 2021, WIPO, 6 pages.

ISA State Intellectual Property Office of the People's Republic of China, Written Opinion of the International Searching Authority Issued in Application No. PCT/CN2020/125413, Jan. 29, 2021, WIPO, 5 pages.(Submitted with Machine/Partial Translation).

* cited by examiner

SCHOTTKY DIODE AND MANUFACTURING METHOD THEREFOR

CROSS REFERENCE TO RELATED APPLICATIONS

This application is a national phase entry of and claims priority to International Patent Application No. PCT/CN2020/125413 (filed 30 Oct. 2020), which claims priority to Chinese Patent Application No. 2020100264931 (filed Jan. 10, 2020), the entire content contents of which is are incorporated herein by reference.

TECHNICAL FIELD

The present disclosure relates to the field of semiconductor technologies, and in particular to a Schottky diode and a manufacturing method therefor.

BACKGROUND

Due to high switching frequency and low forward voltage drop and the like, Schottky diodes are widely applied and gradually replace silicon applied on high power semiconductor devices. Generally, an anode layer of a Schottky diode is directly formed on a heterogeneous structure layer, such that the heterogeneous structure layer has large leakage characteristics in a high temperature environment.

SUMMARY

The present disclosure provides a Schottky diode and a manufacturing method therefor to solve the deficiencies of the related art.

According to a first aspect of embodiments of the present disclosure, provided is a Schottky diode, including:
a nitride channel layer;
a nitride barrier layer, formed on the nitride channel layer;
a nitride cap layer, formed on the nitride barrier layer, wherein the nitride cap layer includes an active region and an inactive region;
a passivation layer, formed on the nitride cap layer, wherein the passivation layer includes a first groove penetrating through the passivation layer to expose a part of the nitride cap layer, and the first groove corresponds to the active region;
a dielectric layer, located on the passivation layer and an inner wall of the first groove, wherein the dielectric layer forms a second groove, and the dielectric layer includes a third groove penetrating through the dielectric layer to expose a part of the active region of the nitride cap layer; and
an anode layer, formed in the second groove and the third groove, wherein the anode layer is in contact with the active region.

Optionally, the nitride cap layer includes a fourth groove formed in the active region, the fourth groove penetrates through the nitride cap layer to expose a part of the nitride barrier layer, and the fourth groove is in communication with the third groove.

The anode layer includes a first anode layer and a second anode layer. The first anode layer is formed in the second groove, and the second anode layer is formed in the third groove and the fourth groove and is in contact with the nitride barrier layer.

Optionally, the Schottky diode further includes:
a fifth groove and a sixth groove, wherein the fifth groove and the sixth groove are located at both sides of the anode layer respectively, and the fifth groove and the sixth groove penetrate through the dielectric layer, the passivation layer and the nitride cap layer in sequence respectively to the nitride barrier layer; and
a cathode layer, formed in the fifth groove and the sixth groove and being in contact with the nitride barrier layer.

Optionally, a blocking layer is disposed between the nitride barrier layer and the nitride cap layer.

Optionally, the active region is a P-type nitride cap layer.

Optionally, the nitride cap layer includes a nitride cap layer doped with magnesium element.

Optionally, a doping concentration of the magnesium element is between $1E16/cm^3$ and $5E20/cm^3$.

Optionally, the nitride channel layer includes a gallium nitride channel layer, and the nitride barrier layer includes an aluminum gallium nitride barrier layer.

Optionally, the Schottky diode further includes:
a seventh groove, formed on at least one side of the third groove and being in communication with the second groove or not, wherein the seventh groove penetrates through the dielectric layer to the nitride cap layer, and/or the seventh groove penetrates through the dielectric layer to be partially into or through the nitride cap layer; the anode layer is formed in the seventh groove.

According to a second aspect of embodiments of the present disclosure, provided is a method of manufacturing a Schottky diode, including:
forming a nitride channel layer;
forming a nitride barrier layer on the nitride channel layer;
forming a nitride cap layer on the nitride barrier layer;
forming a passivation layer on the nitride cap layer;
forming a first groove, wherein the first groove penetrates through the passivation layer to expose a part of the nitride cap layer;
forming a dielectric layer, wherein the dielectric layer is located on the passivation layer and an inner wall of the first groove, and the dielectric layer forms a second groove;
annealing a structure to be processed in which the second groove is formed to form an active region in a region of the nitride cap layer corresponding to the first groove, and form an inactive region in a region of the nitride cap layer covered by the passivation layer;
forming a third groove on the structure to be processed, wherein the third groove penetrates through the dielectric layer to expose a part of the active region of the nitride cap layer; and
forming an anode layer in the second groove and the third groove, wherein the anode layer is in contact with the active region.

Optionally, the method further includes:
forming a fourth groove, wherein the fourth groove penetrates through the nitride cap layer to expose a part of the nitride barrier layer and the fourth groove is in communication with the third groove;
forming the anode layer in the second groove and the third groove includes:
forming a second anode layer in the third groove and the fourth groove, and keeping the second anode layer in contact with the nitride barrier layer; and
forming a first anode layer in the second groove.

Optionally, the method further includes:
forming a fifth groove and a sixth groove, wherein the anode layer is located between the fifth groove and the sixth groove, and the fifth groove and the sixth groove penetrate through the dielectric layer, the passivation layer and the nitride cap layer in sequence respectively to the nitride barrier layer; and
forming a cathode layer in the fifth groove and the sixth groove.

Optionally, the method further includes:
forming a seventh groove on at least one side of the third groove, and keeping the seventh groove in communication with the second groove or not, wherein the seventh groove penetrates through the dielectric layer to the nitride cap layer, and/or the seventh groove penetrates through the dielectric layer to be partially into or through the nitride cap layer; and
forming the first anode layer in the seventh groove.

The technical solution provided by the embodiments of the present disclosure may include the following beneficial effects.

In the present disclosure, Schottky contact is formed between the anode layer and the nitride cap layer so as to effectively avoid direct contact between the anode layer and the heterogeneous structure layer including the nitride channel layer and the nitride barrier layer, balance a contradiction of a forward turn-on voltage and a reverse leakage characteristic of the Schottky diode and inhibit the leakage characteristic of the heterogeneous structure layer in a high temperature environment. Furthermore, due to contact between the anode layer and the active region of the nitride cap layer, a high hole concentration of the active region will be helpful to improving device performance. In addition, by disposing a blocking layer which is difficult to decompose at high temperature, the grooves will not penetrate through the blocking layer in a process of growing other epitaxial layers at high temperature subsequently. In this case, a depth of the grooves will not be lower than that of the blocking layer, thus accurately controlling an etching depth of the grooves.

It should be understood that the above general descriptions and subsequent detailed descriptions are merely illustrative and explanatory rather than limiting of the present disclosure.

BRIEF DESCRIPTION OF THE DRAWINGS

The accompanying drawings, which are incorporated in and constitute a part of the present description, illustrate embodiments consistent with the present disclosure and serve to explain the principles of the present disclosure together with the description.

DETAILED DESCRIPTION OF THE EMBODIMENTS

Exemplary embodiments will be described in detail herein, with the illustrations thereof represented in the drawings. When the following descriptions involve the drawings, like numerals in different drawings refer to like or similar elements unless otherwise indicated. The embodiments described in the following examples do not represent all embodiments consistent with the present disclosure. Rather, they are merely examples of apparatuses and methods consistent with some aspects of the present disclosure as detailed in the appended claims.

The terms used in the present disclosure are for the purpose of describing particular embodiments only, and are not intended to limit the present disclosure. Terms "a", "the" and "said" in their singular forms in the present disclosure and the appended claims are also intended to include plurality, unless clearly indicated otherwise in the context. It should also be understood that the term "and/or" as used herein refers to and includes any and all possible combinations of one or more of the associated listed items.

It is to be understood that, although the terms "first," "second," "third," and the like may be used in the present disclosure to describe various information, such information should not be limited to these terms. These terms are only used to distinguish one category of information from another. For example, without departing from the scope of the present disclosure, first information may be referred as second information; and similarly, the second information may also be referred as the first information. Depending on the context, the term "if" as used herein may be interpreted as "when" or "upon" or "in response to determining".

Figure 1:
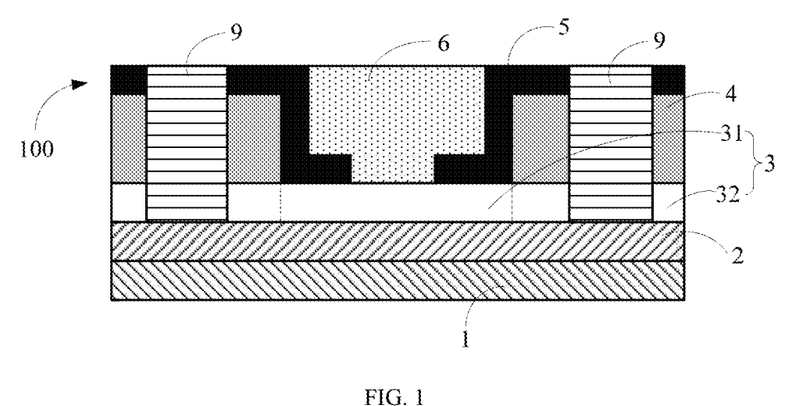
FIG. 1 is a structural schematic diagram illustrating a Schottky diode according to an embodiment of the present disclosure.

FIG. 1 is a structural schematic diagram illustrating a Schottky diode according to an embodiment of the present disclosure. As shown in FIG. 1, the Schottky diode 100 may include a nitride channel layer 1, a nitride barrier layer 2, a nitride cap layer 3, a passivation layer 4 and a dielectric layer 5. The nitride barrier layer 2 is formed on the nitride channel layer 1. The nitride channel layer 1 may be made of one or more of GaN or AlN, and the nitride barrier layer 2 may be made of one or more of AlN, GaN, AlGaN or InN, which is not limited herein. Furthermore, the nitride cap layer 3 may be formed on the nitride barrier layer 2, and the nitride cap layer 3 may include an active region 31 and an inactive region 32. The passivation layer 4 is formed on the nitride cap layer 3. The passivation layer 4 has the functions of passivation and protection to reduce a surface state of the nitride cap layer 3 and effectively diminish a current collapse effect. The passivation layer 4 may be one or more of silicon nitride, silicon aluminum nitrogen, or silicon dioxide. The passivation layer 4 may be formed on the nitride cap layer 3 by one or more of plasma enhanced chemical vapor deposition (PECVD), low pressure chemical vapor deposition (LPCVD), atomic layer deposition (ALD) or metal-organic chemical vapor deposition (MOCVD).

The passivation layer 4 may include a first groove which penetrates through the passivation layer 4 to expose a part of the nitride cap layer 3. Further, the first groove corresponds to the active region 31. The dielectric layer 5 may be formed on the passivation layer 4 and an inner wall of the first groove. With the dielectric layer 5, gate leakage can be reduced to enable the Schottky diode 100 to have a high voltage withstand value. The dielectric layer 5 may include one or more of an aluminum nitride dielectric layer, a silicon nitride dielectric layer, an aluminum oxide dielectric layer, an aluminum oxynitride dielectric layer or a silicon dioxide dielectric layer, which is not limited herein.

Because the dielectric layer 5 is in contact with the inner wall of the first groove, the dielectric layer 5 can form a second groove. Furthermore, the dielectric layer 5 may further include a third groove penetrating through the dielectric layer 5 to expose a part of the active region 31 of the nitride cap layer 3. With the first groove, the second groove and the third groove, an inwardly-recessed space may be formed, and a part of the active region 31 of the nitride cap layer 3 may be exposed by the third groove. The Schottky diode 100 may further include an anode layer 6 and a cathode layer 9. The anode layer 6 is formed in the second groove and the third groove. Because the third groove exposes a part of the active region 31 of the nitride cap layer 3, the anode layer 6 may form Schottky contact with the active region 31. The anode layer 6 may achieve Schottky contact by use of a metal of a high work function, for example, Schottky contact with the heterogeneous structure layer may be formed by use of the anode layer 6 of a metal of Ni, Au or Pt.

As known from the above embodiment, Schottky contact is formed between the anode layer 6 and the nitride cap layer 3 to effectively avoid direct contact between the anode layer 6 and a heterogeneous structure layer including the nitride channel layer 1 and the nitride barrier layer 2, thereby balancing a contradiction of a forward turn-on voltage and a reverse leakage characteristic of the Schottky diode 100 and effectively relieving the leakage characteristic of the heterogeneous structure layer in a high temperature environment. Furthermore, due to contact between the anode layer 6 and the active region 31 of the nitride cap layer 3, a high hole concentration of the active region 31 will be helpful to improving device performance.

In this embodiment, the nitride cap layer 3 may include a P-type nitride cap layer, for example, a P-type nitride cap layer formed by doping magnesium element. Optionally, the nitride cap layer 3 may be a P-type nitride cap layer obtained by performing magnesium element doping based on GaN, where a doping concentration of the magnesium element is between $1E16/cm^3$ and $5E20/cm^3$. Furthermore, the active region 31 may be formed by annealing the nitride cap layer 3. In an embodiment, a process procedure may include: forming the nitride channel layer 1, the nitride barrier layer 2, the nitride cap layer 3 and the passivation layer 4 by stacking in sequence, and then forming the first groove penetrating through the passivation layer 4 to the nitride cap layer 3 on the passivation layer 4, and then placing a structure in which the first groove is formed into an atmosphere free of hydrogen for annealing, for example, placing the structure into nitrogen, nitrogen monoxide, air or a mixture of nitrogen and oxygen. Because the nitride cap layer 3 corresponding to the first groove region is not blocked by the passivation layer 4, hydrogen atoms are overflowed and magnesium atoms are activated, thereby forming the active region 31. However, because hydrogen atoms have no channel to overflow in a region of the nitride cap layer 3 blocked by the passivation layer 4, the region of the nitride cap layer 3 blocked by the passivation layer 4 is still in a semi-insulated state, thereby forming the inactive region 32.

Figure 2:
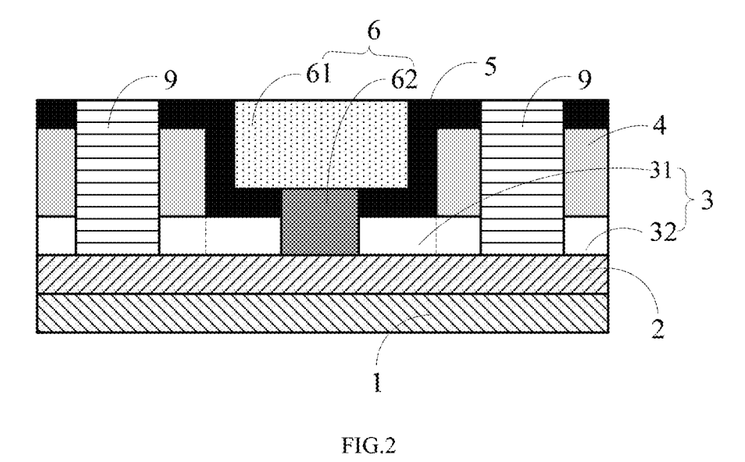
FIG. 2 is a structural schematic diagram illustrating another Schottky diode according to an embodiment of the present disclosure.

In an embodiment, as shown in FIG. 2, the nitride cap layer 3 may further include a fourth groove formed in the active region 31. The fourth groove penetrates through the nitride cap layer 3 to expose a part of the nitride barrier layer 2, and the fourth groove is in communication with the third groove. Thus, the anode layer 6 may be in contact with the nitride barrier layer 2 through the fourth groove. Specifically, the anode layer 6 may include a first anode layer 61 and a second anode layer 62. As shown in FIG. 2, the first anode layer 61 may be formed in the second groove and the first anode layer 61 formed in the second groove may form Schottky contact in cooperation with the active region 31; the second anode layer 62 may be formed in the third groove and the fourth groove, and the second anode layer 62 formed in the third groove and the fourth groove forms ohmic contact with the heterogeneous structure layer including the nitride channel layer 1 and the nitride barrier layer 2. Optionally, as shown in FIG. 2, side walls of the third groove and the fourth groove may be flushed with each other.

It should be noted that the first groove, the third groove and the fourth groove in the above embodiment may be formed by an etching process whereas the second groove may be formed along a side wall of the first groove when the dielectric layer 5 is sputtered along a surface of the passivation layer 4. Furthermore, since the third groove is formed by penetrating through the bottom surface of the second groove, a width of the third groove is smaller than or equal to a width of the second groove.

Figure 7:
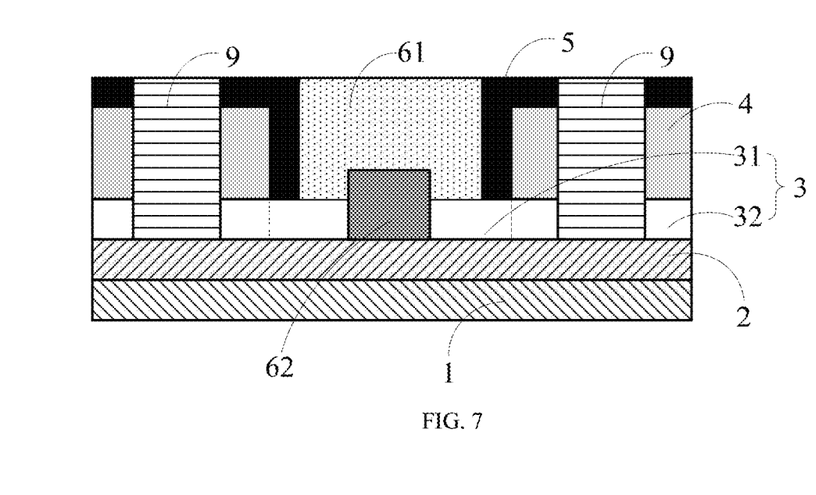
FIG. 7 is a structural schematic diagram illustrating yet another Schottky diode according to an embodiment of the present disclosure.

In an embodiment, as shown in FIG. 7, the Schottky diode may further include a seventh groove formed in the dielectric layer. The seventh groove is located on at least one side of the third groove and penetrated through the dielectric layer 5 to the active region 31 of the nitride cap layer 3, and the seventh groove is in communication with the second groove. As shown in FIG. 7, in an embodiment, the anode layer 6 may include the first anode layer 61 and the second anode layer 62. The first anode layer 61 may be formed in the second groove and the seventh groove, and the first anode layer 61 formed in the second groove and the seventh groove may form Schottky contact in cooperation with the active region 31; the second anode layer 62 may be formed in the third groove and the fourth groove, and the second anode layer 62 formed in the third groove and the fourth groove may form ohmic contact with the heterogeneous structure layer including the nitride channel layer 1 and the nitride barrier layer 2. In another embodiment, the seventh groove penetrates through the dielectric layer 5 to be partially into or through the active region 31 of the nitride cap layer 3, such that the first anode layer 61 formed in the second groove and the seventh groove forms Schottky contact or ohmic contact.

In the above embodiments, the Schottky diode 100 may further include a fifth groove, a sixth groove and a cathode layer 9. The anode layer 6 is located between the fifth groove and the sixth groove, and the fifth groove and the sixth groove penetrate through the dielectric layer 5, the passivation layer 4 and the nitride cap layer 3 in sequence respectively to the nitride barrier layer 2. The cathode layer 9 is formed in the fifth groove and the sixth groove to form ohmic contact with the nitride barrier layer 2.

Figure 3:
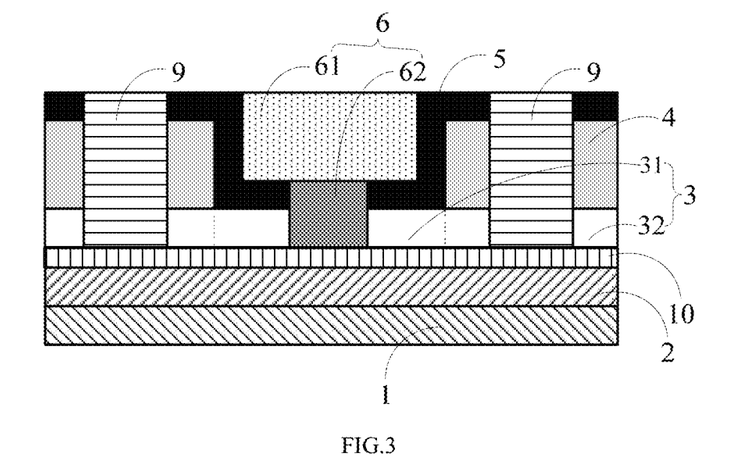
FIG. 3 is a structural schematic diagram illustrating another Schottky diode according to an embodiment of the present disclosure.

As shown in FIG. 3, the Schottky diode 100 may further include a blocking layer 10 located between the nitride barrier layer 2 and the nitride cap layer 3. The blocking layer 10 may be used to define an etching depth. The blocking layer 10 may include an aluminum gallium nitrogen layer. By disposing the blocking layer 10, a depth of the fourth groove can be accurately controlled.

The fifth groove and the sixth groove may be formed by an etching process. The cathode layer 9 may be formed in the fifth groove and the sixth groove through a deposition process. The deposition process includes one or more of PECVD, LPCVD, ALD or MOCVD. The cathode layer 9 may include one or more metal materials of Ti, Al, Ni or Au.

Figure 4:
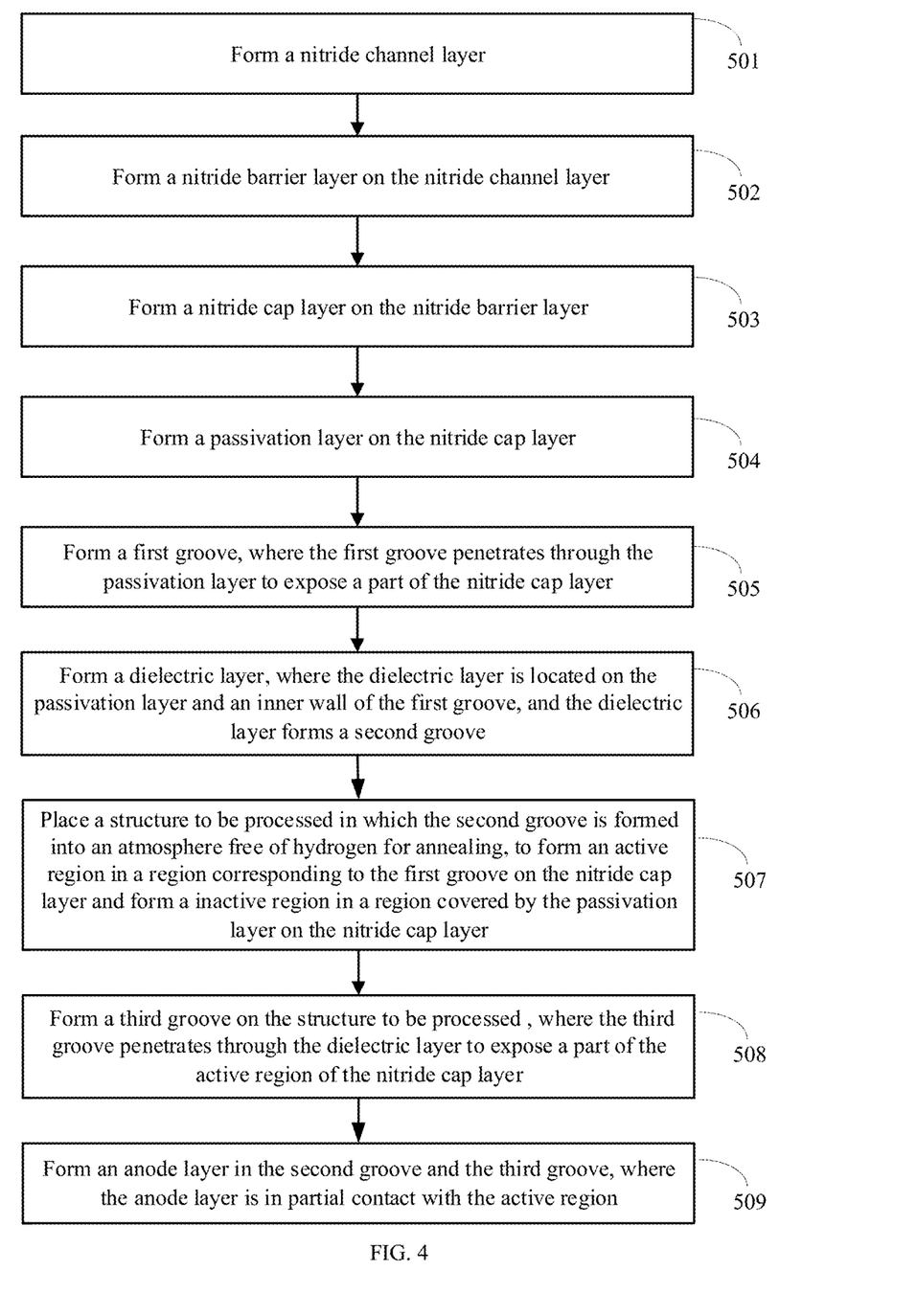
FIG. 4 is a flowchart illustrating a manufacturing process of a Schottky diode according to an embodiment of the present disclosure.

Based on the above technical solution, the present disclosure further provides a method of manufacturing a Schottky diode. Reference may be made to the above descriptions of the product for relevant parts. As shown in FIG. 4, the manufacturing method may include the following steps.

At step 501, a nitride channel layer 1 is formed.

At step 502, a nitride barrier layer 2 is formed on the nitride channel layer 1.

At step 503, a nitride cap layer 3 is formed on the nitride barrier layer 2.

At step 504, a passivation layer 4 is formed on the nitride cap layer 3.

At step 505, a first groove 41 is formed, where the first groove 41 penetrates through the passivation layer 4 to expose a part of the nitride cap layer 3.

Figure 5:
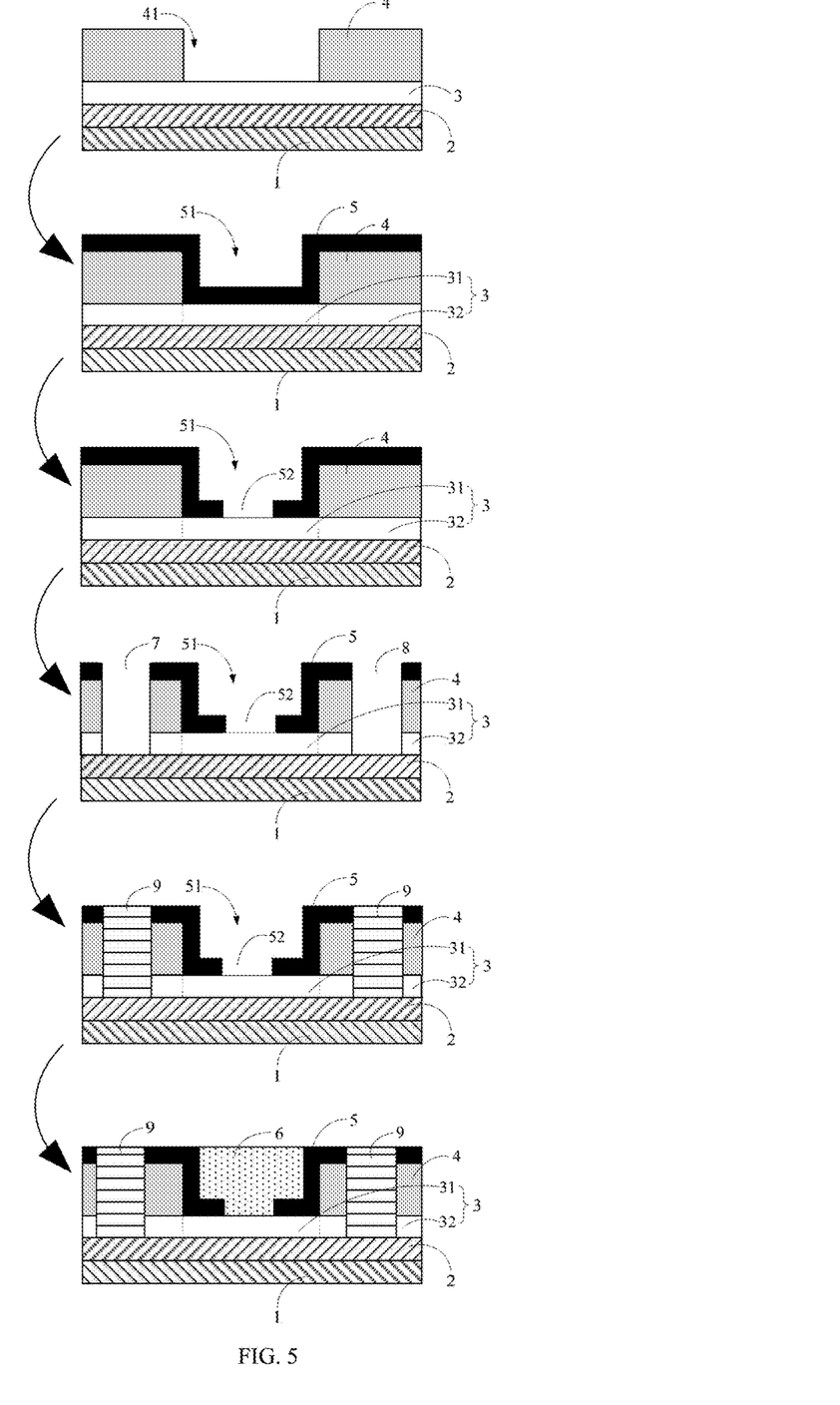
FIG. 5 is a manufacturing flowchart illustrating another Schottky diode according to an embodiment of the present disclosure.

In this embodiment, as shown in FIG. 5, the nitride channel layer 1, the nitride barrier layer 2, the nitride cap layer 3 and the passivation layer 4 are formed by stacking in sequence on a substrate, and the first groove 41 is formed on the passivation layer 4 through an etching process. The first groove 41 penetrates through the passivation layer 4 to expose a part of the nitride cap layer 3. A nitride buffer layer (not shown) may be further formed between the nitride channel layer 1 and the nitride barrier layer 2, or a nitride nucleation layer (not shown) may be further formed under the nitride cap layer 3 as shown in FIG. 5, or a blocking layer may be further formed between the nitride barrier layer 2 and the nitride cap layer 3, which is not limited herein.

At step 506, a dielectric layer 5 is formed, where the dielectric layer 5 is located on the passivation layer 4 and an inner wall of the first groove 41, and a second groove 51 is formed by the dielectric layer 5.

At step 507, a to-be-processed structure in which the second groove is formed is annealed to form an active region 31 in a region of the nitride cap layer 3 corresponding to the first groove and form an inactive region 32 in a region of the nitride cap layer 3 covered by the passivation layer 4.

In this embodiment, as shown in FIG. 5, based on the structure obtained at step 505, the dielectric layer 5 may be further formed on the passivation layer 4 through a deposition process. The dielectric layer 5 is in contact with the passivation layer 4, and the dielectric layer 5 is in contact with an inner wall of the first groove 41, such that a second groove 51 is surrounded by the dielectric layer 5.

Furthermore, magnesium element may be doped in a preset region on the nitride cap layer 3. Optionally, the magnesium element doping may be performed based on GaN, with a doping concentration of the magnesium element being between $1E16/cm^3$ and $5E20/cm^3$. Afterwards, the to-be-processed structure, in which magnesium element is doped and the second groove 51 is formed, is placed into an atmosphere free of hydrogen for annealing, for example, into nitrogen, nitrogen monoxide, air, or a mixture of nitrogen and oxygen for annealing. Because the nitride cap layer 3 corresponding to the first groove 41 region is not blocked by the passivation layer 4, hydrogen atoms are overflowed and magnesium atoms are activated. In this case, a P-type nitride cap layer is obtained by activating the preset region, thereby obtaining the active region 31. However, because hydrogen atoms have no channel to overflow in a region of the nitride cap layer 3 blocked by the passivation layer 4, the region of the nitride cap layer 3 blocked by the passivation layer 4 is still in a semi-insulated state, thereby forming the inactive region 32. In FIG. 5, the active region 31 and the inactive region 32 are distinguished by dashed lines marked on the nitride cap layer 3.

At step 508, a third groove 52 is formed on the structure to be processed, where the third groove 52 penetrates through the dielectric layer 5 to expose a part of the active region 31 of the nitride cap layer 3.

At step 509, an anode layer 6 is formed in the second groove 51 and the third groove 52, where the anode layer 6 is in partial contact with the active region 31.

In this embodiment, the third groove 52 is formed on the annealed to-be-processed structure by an etching process. The third groove 52 penetrates through the dielectric layer 5 to expose a part of the active region 31. Further, the anode layer 6 may be formed in the third groove 52 and the second groove 51 by deposition. The anode layer 6 is in partial contact with the active region 31 and forms Schottky contact with the nitride cap layer 3.

Figure 6:
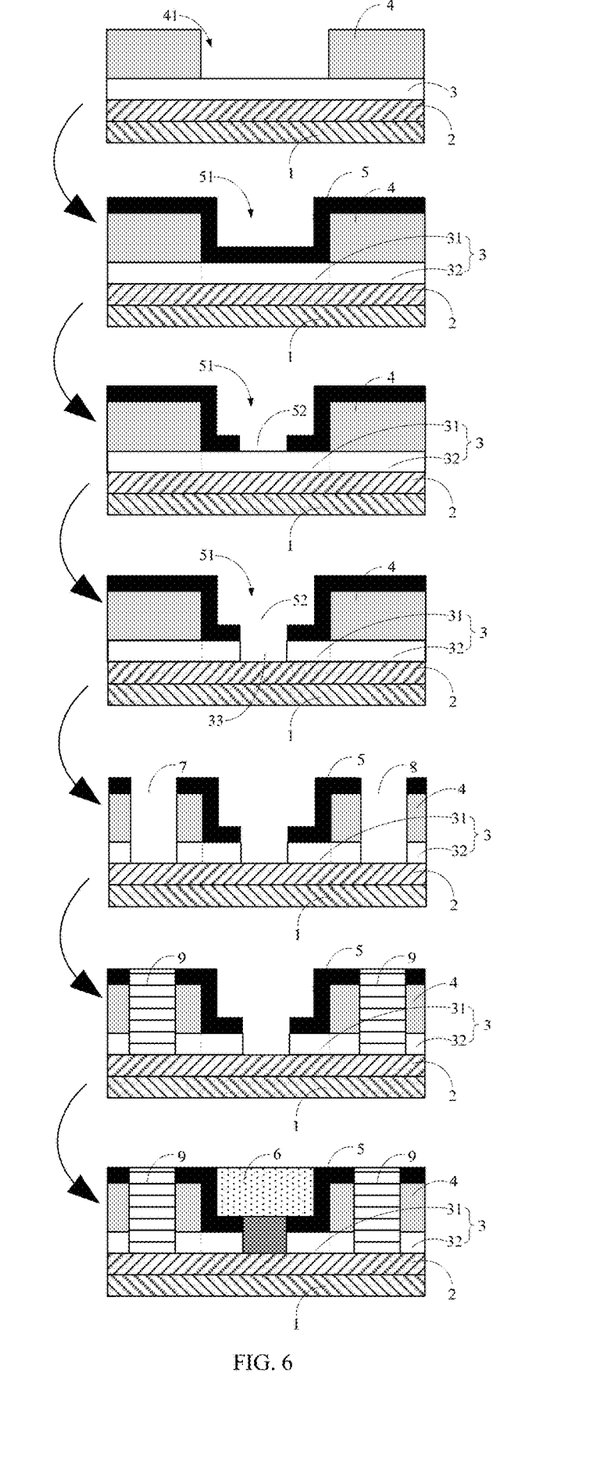
FIG. 6 is a manufacturing flowchart illustrating another Schottky diode according to an embodiment of the present disclosure.

In another embodiment, as shown in FIG. 6, the step of forming the third groove 52 and the steps before formation of the third groove 52 in the embodiment shown in FIG. 6 are identical to those in the embodiment of FIG. 5. Further, in the embodiment shown in FIG. 6, a fourth groove 33 may be formed corresponding to the third groove 52. The fourth groove 33 penetrates through the active region 31 to the nitride barrier layer 2 to expose a part of the nitride barrier layer 2. The anode layer 6 may be deposited in the second groove 51, the third groove 52 and the fourth groove 33. The anode layer 6 formed in the second groove 51 may form Schottky contact in cooperation with the active region 31; the anode layer 6 formed in the third groove 52 and the fourth groove 33 may form ohmic contact with a heterogeneous structure layer including the nitride channel layer 1 and the nitride barrier layer 2.

Figure 8:
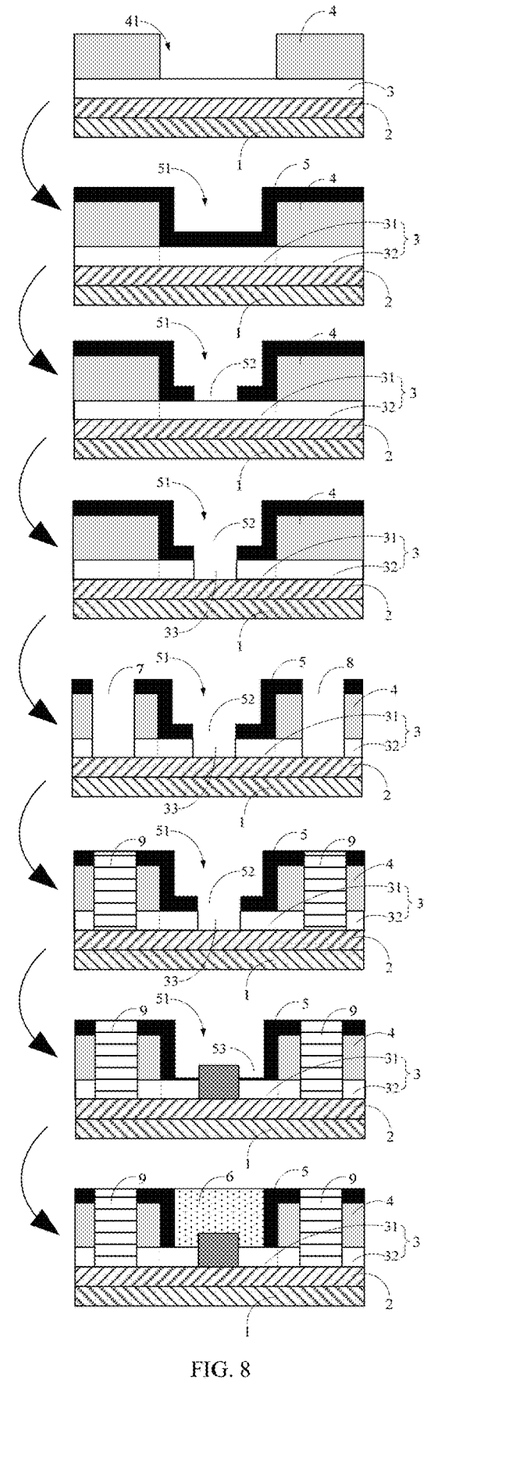
FIG. 8 is a manufacturing flowchart illustrating yet another Schottky diode according to an embodiment of the present disclosure.

In an embodiment, as shown in FIG. 8, the step of forming the third groove 52 and the steps before formation of the third groove 52 in the embodiment of FIG. 8 are identical to those in the embodiment shown in FIG. 5. Furthermore, in the embodiment of FIG. 8, a seventh groove 53 may be formed on at least one side of the third groove 52, and the seventh groove 53 is in communication with the second groove 51. The seventh groove 53 penetrates through the dielectric layer 5 to the nitride cap layer 3. The anode layer 6 may be deposited in the second groove 51, the third groove 52, the fourth groove 33 and the seventh groove 53. In this case, the anode layer 6 formed in the second groove 51 and the seventh layer 53 may form Schottky contact in cooperation with the active region 31; the anode layer 6 formed in the third groove 52 and the fourth groove 33 may form ohmic contact with the heterogeneous structure layer including the nitride channel layer 1 and the nitride barrier layer 2. In another embodiment, the seventh groove 53 may penetrate through the dielectric layer 5 to be partially into or through the active region 31 of the nitride cap layer 3, such that the anode layer 6 formed in the second groove 51 and the seventh groove 53 forms Schottky contact or ohmic contact.

Based on the embodiments of FIGS. 5, 6 and 8, the above manufacturing process may further include forming a fifth groove 7 and a sixth groove 8. The anode layer 6 is located between the fifth groove 7 and the sixth groove 8. The fifth groove 7 and the sixth groove 8 penetrate through the dielectric layer 5, the passivation layer 4, the nitride cap layer 3 to the nitride barrier layer 2 in sequence respectively. Furthermore, as shown in FIGS. 5 and 6, a cathode layer 9 may be further formed in the fifth groove 7 and the sixth groove 8, and the cathode layer 9 is in contact with the nitride barrier layer 2 to form ohmic contact.

It is noted that in the embodiments of the FIGS. 5 and 6, illustrative descriptions are made by firstly forming the cathode layer 9 in the fifth groove 7 and the sixth groove 8 and then depositing the anode layer 6 in the second groove 51, the third groove 52, and the fourth groove 33 as an example. Actually, in some other embodiments, the anode layer 6 may be firstly deposited in the second groove 51, the third groove 52 and the fourth groove 33, and then the cathode layer 9 is formed in the fifth groove 7 and the sixth groove 8. Therefore, no limitation is made to the deposition sequence of the anode layer 6 and the cathode layer 9 in the present disclosure.

Other implementations of the present disclosure will be apparent to those skilled in the art from consideration of the specification and practice of the present disclosure herein. The present disclosure is intended to cover any variations, uses, modification or adaptations of the present disclosure that follow the general principles thereof and include common knowledge or conventional technical means in the related art that are not disclosed in the present disclosure. The specification and embodiments are considered as exemplary only, with a true scope and spirit of the present disclosure being indicated by the following claims.

It is to be understood that the present disclosure is not limited to the precise structure described above and shown in the accompanying drawings, and that various modifications and changes may be made without departing from the scope thereof. The scope of the present disclosure is limited only by the appended claims.

The invention claimed is:

1. A Schottky diode, comprising: a nitride channel layer;
a nitride barrier layer, formed on the nitride channel layer;
a nitride cap layer, formed on the nitride barrier layer, wherein the nitride cap layer comprises an active region and an inactive region;
a passivation layer, formed on the nitride cap layer, wherein the passivation layer comprises a first groove penetrating through the passivation layer to expose a part of the nitride cap layer, and the first groove corresponds to the active region;
a dielectric layer, located on the passivation layer and an inner wall of the first groove, wherein the dielectric layer forms a second groove, and the dielectric layer comprises a third groove penetrating through the dielectric layer to expose a part of the active region of the nitride cap layer;
an anode layer, formed in the second groove and the third groove, wherein the anode layer is in contact with the active region, wherein the anode layer comprises a first anode layer and a second anode layer, the first anode layer is formed in the second groove, and the second anode layer is formed in the third groove, wherein an uppermost surface of the second anode layer is in direct contact with a lowermost surface of the first anode layer;
a fifth groove and a sixth groove, wherein the fifth groove and the sixth groove at located at opposite sides of the anode layer respectively, and the fifth groove and the sixth groove penetrate through the dielectric layer, the passivation layer and the nitride cap layer in sequence respectively towards the nitride barrier layer; and a cathode layer, formed in the fifth groove and the sixth groove.

2. The Schottky diode of claim 1, wherein the nitride cap layer comprises a fourth groove formed in the active region, the fourth groove penetrates through the nitride cap layer to expose a part of the nitride barrier layer, and the fourth groove is in communication with the third groove; the fourth groove and is in contact with the nitride barrier layer.

3. The Schottky diode of claim 1, wherein the third groove has a smaller width than the second groove.

4. The Schottky diode of claim 1, the cathode layer is in contact with the nitride barrier layer.

5. The Schottky diode of claim 1, wherein a blocking layer is disposed between the nitride barrier layer and the nitride cap layer.

6. The Schottky diode of claim 1, wherein the active region is a P-type nitride cap layer.

7. The Schottky diode of claim 6, wherein the P-type nitride cap layer is doped with magnesium element.

8. The Schottky diode of claim 7, wherein a doping concentration of the magnesium element is between $1E16/cm3$ and $5E20/cm3$.

9. The Schottky diode of claim 1, wherein the nitride channel layer comprises a gallium nitride channel layer, and the nitride barrier layer comprises an aluminum gallium nitride barrier layer.

10. The Schottky diode of claim 1, further comprising:
a seventh groove, formed on at least one side of the third groove and being in communication with the second groove or not, wherein the seventh groove penetrates through the dielectric layer to the nitride cap layer, and/or the seventh groove penetrates through the dielectric layer to be partially into or through the nitride cap layer;
wherein the anode layer is further formed in the seventh groove.

* * * * *